United States Patent [19]
Blanchet-Fincher et al.

[11] Patent Number: 5,006,434
[45] Date of Patent: Apr. 9, 1991

[54] PHOTOHARDENABLE ELECTROSTATIC ELEMENT WITH IMPROVED ENVIRONMENTAL LATITUDE

[75] Inventors: Graciela B. Blanchet-Fincher; Catherine T. Chang; Curtis R. Fincher, Jr., all of Wilmington, Del.

[73] Assignee: E. I. Du Pont de Nemours and Company, Wilmington, Del.

[21] Appl. No.: 351,361

[22] Filed: May 12, 1989

[51] Int. Cl.$^5$ .................. G03G 13/28; G03C 1/725; G03C 1/73; G03C 1/735
[52] U.S. Cl. ......................... 430/49; 430/281
[58] Field of Search ................. 430/49, 281

[56] References Cited

U.S. PATENT DOCUMENTS

| | | | |
|---|---|---|---|
| 4,273,857 | 6/1981 | Leberzammer et al. | 430/281 |
| 4,659,645 | 4/1987 | Frommeld et al. | 430/175 |
| 4,732,831 | 3/1988 | Riesenfeld et al. | 430/49 |
| 4,869,996 | 9/1989 | McCartin et al. | 430/286 |
| 4,892,802 | 1/1990 | Bauer et al. | 430/270 |

Primary Examiner—Marion E. McCamish
Assistant Examiner—S. Crossan

[57] ABSTRACT

Photohardenable electrostatic master with improved environmental latitude comprising
(1) an electrically conductive substrate, and
(2) a layer of photohardenable composition consisting essentially of
  (a) at least two organic polymeric binder, at least one having a Tg greater than 80° C. and at least one having a Tg less than 70° C.,
  (b) at least one monomeric compound having at least one ethylenically unsaturated group, and
  (c) a photoinitiator or photoinitiator system, the shift in transit time ($a_T$) of the photohardenable layer in the range of 30% $\leq$ relative humidity $\leq$ 60% and 15.6° C. $\leq$ temperature $\leq$ 26.7° C. is 15 or less, preferably 10 or less. A xeroprinting process is described using the master. The master is used in graphic arts, color proofing which duplicates images produced by printing, preparation of printed circuit boards, resists, soldermasks, etc.

30 Claims, No Drawings

PHOTOHARDENABLE ELECTROSTATIC ELEMENT WITH IMPROVED ENVIRONMENTAL LATITUDE

DESCRIPTION

1. FIELD OF THE INVENTION

This invention relates to a photohardenable electrostatic master for xeroprinting. More particularly this invention relates to a photohardenable electrostatic master having on an electrically conductive substrate a layer of a photohardenable composition which contains at least two polymeric binders, at least one binder having a relatively high glass transition temperature and at least one binder having a relatively low glass transition temperature.

2. BACKGROUND OF THE INVENTION

The xeroprinting process employs a printing plate, commonly referred to as a "master", made by creating a pattern of insulating material (i.e., an image) on the surface of a grounded conductive substrate. In the xeroprinting process, an electrostatic charge is applied to the surface of the master, e.g., by corona discharge. The portion of the master bearing the insulating material retains the charge, while the charge on the remainder of the master is discharged through the grounded conductive substrate. Thus, a latent image of electrostatic charge is formed on the insulating material, the image subsequently being developed with either oppositely charged particles commonly referred to as "toner" or liquid electrostatic developers. The toner is then transferred (e.g., by electrostatic or other means) to another surface (e.g., paper or polymeric film), where it is fused (i.e., "fixed"), to reproduce the image of the master. Since the image on the master is permanent, or at least persistent, multiple copies can be made by repeating the charging, toning and transfer steps.

Recently issued U.S. Pat. No. 4,732,831 to Riesenfeld et al. discloses an improved xeroprinting process that employs a master having a photopolymerizable coating on a conducting substrate. The coating contains an organic polymeric binder, an ethylenically unsaturated monomer, and a photoinitiator system. When the master is exposed to the desired pattern of actinic radiation (i.e., light of a suitable wavelength), exposed regions of the coating polymerize and exhibit a significantly higher electrical resistance than unexposed regions. Thus, when the master is subsequently used in the xeroprinting process, the polymerized regions will hold an electrical charge, which is developed with toner, while the unpolymerized regions discharge to ground through the conductive backing and therefore do not attract the toner.

It has been found that the electrostatic properties of photopolymerizable masters change considerably with small variations in ambient temperature around room temperature (RT). Relatively small changes in humidity at these temperature conditions also affects electrostatic properties. For example, the discharge rates of the photopolymerizable layer increase with a rise in temperature. Changes in the discharge rate with ambient temperature result in degradation of print quality as well as unacceptable dot gain and dot range. Lower temperatures (RT−5° C.) show lack of shadow dots while at higher temperatures (RT+5° C.) highlight dots and dot gains diminish.

There has been no attempt to understand the change in resistivity upon exposure of a photopolymerizable element or the details of the conduction mechanism. Transport of charge in photopolymerizable elements, however, has been studied. The photopolymerizable electrostatic master when unexposed has its glass transition temperature (Tg) near ambient temperature. The electrical conductivity is the result of conduction by impurity ions with a reasonable degree of mobility in the liquid-like photopolymerizable layer of high viscosity. Upon imagewise exposure, the Tg of the photopolymerized layer shifts closer to the Tg of the binder component, e.g., about 100° C., and the photopolymerized areas are in a glassy state. The electrical conductivity decreases several orders of magnitude corresponding to the change in charge mobility in the photopolymerized (glassy) areas. The modification of the electrical properties of the photopolymerizable electrostatic master by change in glass transitions made one having ordinary skill in the art believe that the change in Tg affected the temperature and humidity sensitivity of the master as well. Based on this assumption it appeared unlikely that photopolymerizable electrostatic masters would be achieved that were substantially insensitive to the changes in the environment, e.g., temperature and humidity.

It has now been found that a photopolymerizable electrostatic master having improved environmental latitude can be made wherein the above disadvantages are substantially overcome by introducing into the photopolymerizable composition forming the photopolymerizable layer a blend of binders, at least one binder having a relatively higher glass transition temperature than at least one other binder present. The improved photopolymerizable electrostatic master exhibits good image quality, electrical properties and temperature stability.

SUMMARY OF THE INVENTION

In accordance with this invention there is provided an improved photohardenable electrostatic master having reduced temperature and humidity sensitivity comprising (1) an electrically conductive substrate, and
(2) a layer of photohardenable composition consisting essentially of
   (a) at least two organic polymeric binders,
   (b) at least one monomeric compound having at least one ethylenically unsaturated group, and
   (c) a photoinitiator or photoinitiator system that activate polymerization of the ethylenically unsaturated monomer upon exposure to actinic radiation, the improvement wherein the photohardenable composition contains at least one binder having a Tg greater than 80° C. and at least one binder having a Tg less than 70° C. such that the shift in transit time ($a_T$) of the photohardenable layer in the range 30% ≦ relative humidity ≦ 60% and 60° F. (15.6° C.) ≦ temperature ≦ 80° F. (26.7° C.) is 15 or less.

In accordance with an embodiment of this invention there is provided a xeroprinting process comprising (A) exposing imagewise to actinic radiation a photohardenable electrostatic master comprising
(1) an electrically conductive substrate, and
(2) a layer of photohardenable composition consisting essentially of
   (a) at least two organic polymeric binders,
   (b) at least one monomeric compound having at least one ethylenically unsaturated group, and (c) a photoinitiator or photoinitiator system that activates polymerization of the ethylenically unsaturated monomer upon exposure to actinic radiation, the photohardenable composition containing at least one binder having a Tg greater than 80° C. and at least one binder having a Tg less than 70° C. such that the shift in transit time ($a_T$) of the photohardenable layer in the range 30% $\leq$ relative humidity $\leq$ 60% and 60° F. (15.6° C.) $\leq$ temperature $\leq$ 80° F. (26.7° C.) is 15 or less.

(B) charging the photohardenable master electrostatically, (C) applying an oppositely charged electrostatic toner, and (D) transferring the toned image to a receptor surface.

DETAILED DESCRIPTION OF THE INVENTION

Throughout the specification the below-listed terms have the following meanings:

In the claims appended hereto "consisting essentially of" means the composition of the photohardenable layer does not exclude unspecified components which do not prevent the advantages of the layer from being realized. For example, in addition to the primary components, there can be present additional components, such as sensitizers, including visible sensitizers, hydrogen donors or chain transfer agents (preferred), both of which are considered part of the photoinitiator system; thermal stabilizers or thermal polymerization inhibitors, photoinhibitors, antihalation agents, UV absorbers, release agents, colorants, surfactants, plasticizers, electron donors, electron acceptors, charge carriers, etc.

Photohardenable and photopolymerizable are used interchangeably in this invention.

Glass transition temperature (Tg) is the main characteristic temperature above which the amorphous polymer acquires sufficient thermal energy and changes from a glassy to a rubbery state accompanied by significant changes in physical properties due to facilitated molecular motion.

Monomer means simple monomers, as well as polymers, usually of molecular weights below 1500, having at least one, preferably two or more, ethylenic groups capable of crosslinking or addition polymerization.

Photopolymerizable layers of this invention having improved environmental latitude have broadened glass transition temperature in the unexposed state with respect to such layers having a single binder. The glass transition range is broadened by introducing into the formulation a blend of binders having high and low Tg's. Blends of monomers have been found to further improve environmental latitude. The binder mixture consists of at least two materials with different glass transition temperatures. In general, it has been found that a high Tg binder (approximately in the range of 80-110° C. and a low Tg binder (approximately in the range of 50-70° C.) are preferred. The molecular weights of the low Tg binders were found not to have a noticeable effect in the temperature stability of the photohardenable composition and mainly modified coating properties.

The primary components include:

BINDERS

Suitable binders include: acrylate and methacrylate polymers and co- or terpolymers, vinyl polymers and copolymers, polyvinyl acetals, polyesters, polycarbonates, polyurethanes, polysulfones, polyetherimides and polyphenylene oxides, butadiene copolymers, cellulose esters, cellulose ethers, etc. The selection of a polymeric binder depends on its Tg. The Tg of a polymer is affected by the chemical structures of the main chain and the side groups. Polymers with rigid structures generally show high Tg's while more flexible polymers exhibit low Tg's. Polymers of desired Tg's may be obtained by copolymerization of proper combinations of rigid and flexible monomers. The following publication which summarizes glass transition temperatures of homopolymers known in the literature, "POLYMER HANDBOOK", ed. J. Brandrup & E. H. Immergut, John Wiley & Sons, Inc., 1975, is incorporated herein by reference. Section III-140-192 of said publication lists Tg's of most known polymers.

Examples of useful binders having Tg's greater than 80° C. include:

| TRADE NAME OR CODE | CHEMICAL COMPOSITION | Tg (°C.) |
|---|---|---|
| | Vinyl polymers & copolymers | |
| PSMMA | Poly(styrene(70)/methyl methacrylate(30)) | 95 |
| Cycolac ® CTB (Borg-Warner) | Acrylonitrile/butadiene/styrene | 80–84 |
| | Polystyrene | 100 |
| | Poly(alpha-methylstyrene) | 168 |
| | Poly(vinyl chloride) | 80 |
| | Poly(vinylidene chloride) | 100 |
| | Poly(acrylonitrile) | 96 |
| | Methacrylate polymers & copolymers | |
| | Poly(methyl methacrylate) | 110 |
| | Poly(isobornyl methacrylate) | 147 |
| | Poly(phenyl methacrylate) | 110 |
| | Poly(t-butyl methacrylate) | 107 |
| | Poly(isopropyl methacrylate) | 81 |
| | Condensation polymers | |
| Lexan ® 101 (G.E.) | Polycarbonate | 150 |
| | Polysulfone | 190 |
| ULTEM ® (G.E.) | Polyetherimide | 215 |
| | Poly(phenylene oxide) | 210 |
| | Poly(1,4-Cyclohexanedimethanol terephthalate) | 85 |
| | Polyvinyl acetals | |
| | Poly(vinyl acetal) | 83 |
| Formvar ® (Monsanto) | Poly(vinyl formal) | 92–113 |

Examples of useful binders having Tg's less than 70° C. include:

| TRADE NAME OR CODE | CHEMICAL COMPOSITION | Tg (°C.) |
|---|---|---|
| | Acrylate, methacrylate polymers & copolymers | |
| | Poly(ethyl methacrylate) | 70 |
| Elvacite ® 2042 | Poly(ethyl methacrylate) | 65 |
| Elvacite ® 2045 | Poly(isobutyl methacrylate) | 55 |
| Elvacite ® 2014 | Methyl methacrylate copolymer | 40 |
| Elvacite ® 2044 | Poly(n-butyl methacrylate) | 15 |
| Elvacite ® 2046 | Poly(n-butyl/isobutyl methacrylate) | 35 |
| (E. I. du Pont de Nemours & Co.) | Poly(cyclohexyl methacrylate) | 66 |
| | Poly(t-butyl acrylate) | 41 |
| | Vinyl ester & copolymers | |
| | Poly(vinyl acetate) | 32 |
| | Vinyl polymers & copolymers | |
| | Vinyl chloride/vinyl acetate copolymer | 63 |
| | Polyvinyl acetals | |
| Butvar ® (Monsanto) | Poly(vinyl butyral) | 62–68 |
| | Polyurethanes | |

| TRADE NAME OR CODE | CHEMICAL COMPOSITION | Tg (°C.) |
| --- | --- | --- |
| Estane ® 5715 (B. F. Goodrich) | Polyurethane | 16 |
| | Polyesters | |
| | Poly(tetramethylene terephthalate) | 45 |
| | Butadiene copolymers | |
| | Styrene/butadiene copolymers | <70 |
| | Cellulose esters and ethers | |
| | Ethyl cellulose | 43 |

Preferred binders include the Elvacite ® resins because their Tg's range from 15° C. to 105° C. Low Tg resins include poly(ethyl methacrylate) (Tg 70° C.), Elvacite ®2045 or 2042, in combination with high Tg resins poly(methyl methacrylate) (Tg 110° C.) or poly(styrene/methyl methacrylate) are particularly preferred. The binder combination of poly(ethyl methacrylate) (Tg 70° C.) and poly(styrene/methyl methacrylate) gave photopolymerizable compositions with good environmental response and coating properties.

The mixed binders should have a resistivity in the range of $10^{14}$ to $10^{20}$ ohm-cm, preferably $10^{14}$ to $10^{16}$ ohm-cm.

MONOMERS

Any ethylenically unsaturated photopolymerizable or photocrosslinkable compounds suitable for use with hexaarylbiimidazole initiator systems can be used in the practice of this invention.

Preferred monomers which have at least two terminally ethylenically unsaturated groups are di-, tri-, and tetraacrylates and methacrylates such as ethylene glycol diacrylate, diethylene glycol diacrylate, triethylene glycol diacrylate, glycerol diacrylate, glycerol triacrylate, glycerol propoxylated triacrylate, ethylene glycol dimethacrylate, 1,2-propanediol dimethacrylate, 1,2,4-butanetriol trimethacrylate, 1,4-cyclohexanediol diacrylate, 1,4-benzenediol dimethacrylate, pentaerythritol triacrylate, pentaerythritol trimethacrylate, pentaerythritol tetramethacrylate, 1,3-propanediol diacrylate, 1,5-pentanediol dimethacrylate, trimethylolpropane triacrylate, ethoxylated trimethylolpropane triacrylate, the bisacrylates and bismethacrylate of polyethylene glycols of molecular weight 100-500, tris-(2-hydroxyethyl)isocyanurate triacrylate, etc. Especially preferred monomers are glyceryl propoxylated triacrylate, trimethylolpropane triacrylate and tris-(2-hydroxyethyl)isocyanaurate triacrylate.

A monomer with a resistivity in the range of about $10^5$ to $10^9$ ohm-cm is particularly useful. Mixtures of monomers have also been found to enhance the improvement in environmental stability of the photohardenable or photopolymerizable master. Blends of glycerol propoxylated triacrylate and trimethylolpropane triacrylate in a 2:1 ratio were found to give the best overall performance. Other monomer blends, such as tris-(2-hydroxyethyl) isocyanurate triacrylate and trimethylolpropane triacrylate show good temperature stability.

INITIATORS AND/OR INITIATOR SYSTEMS

A large number of free-radical generating compounds can be utilized in the photopolymerizable compositions. Preferred initiator systems are 2,4,5-triphenylimidazolyl dimers with hydrogen donors, also known as the 2,2',4,4',5,5'-hexaarylbiimidazoles, or HABI's, and mixtures thereof, which dissociate on exposure to actinic radiation to form the corresponding triarylimidazolyl free radicals. HABI's and use of HABI-initiated photopolymerizable systems for applications other than for electrostatic uses have been previously disclosed in a number of patents. These include Chambers, U.S. Pat. No. 3,479,185, Chang et al., U.S. Pat. No. 3,549,367, Baum and Henry, U.S. Pat. No. 3,652,275, Cescon, U.S. Pat. No. 3,784,557, Dueber, U.S. Pat. No. 4,162,162, Dessauer, U.S. Pat. No. 4,252,887, Chambers et al., U.S. Pat. No. 4,264,708, Wada et al. U.S. Pat. No. 4,410,621, and Tanaka et al., U.S. Pat. No. 4,459,349, the disclosures of which are incorporated herein by reference. Useful 2,4,5-triarylimidazolyl dimers are disclosed in Baum and Henry, U.S. Pat. No. 3,652,275 column 5, line 44 to column 7, line 16, the disclosure of which is incorporated herein by reference. Any 2-o-substituted HABI disclosed in the prior patents can be used in this invention.

The HABI's can be represented by the general formula

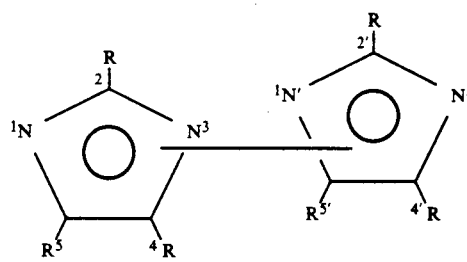

where the R's represent aryl, e.g., phenyl, naphthyl, radicals. The 2-o-substituted HABI's are those in which the aryl radicals at the 2- and 2'-positions are ortho-substituted or with polycyclic condensed aryl radicals. The other positions on the aryl radicals can be unsubstituted or carry any substituent which does not interfere with the dissociation of the HABI upon exposure or adversely affect the electrical or other characteristics of the photopolymer system.

Preferred HABI's are 2-o-chlorosubstituted hexaphenylbiimidazoles in which the other positions on the phenyl radicals are unsubstituted or substituted with chloro, methyl or methoxy. The most preferred initiators include 2-(o-chlorophenyl)-4,5-bis(m-methoxyphenyl)imidazole dimer, 1,1'-biimidazole, 2,2'-bis(o-chlorophenyl)-4,4',5,5'-tetraphenyl-, and 1Himidazole, 2,5-bis(o-chlorophenyl)-4-[3,4-dimethoxyphenyl]-, dimer, each of which is typically used with a hydrogen donor or chain transfer agent described below.

Photoinitiators that are also useful in the photohardenable composition in place of the HABI type photoinitiators include: the substituted or unsubstituted polynuclear quinones, aromatic ketones, and benzoin ethers. Examples of such other photoinitiators are quinones, for example, 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydrobenz(a)anthracene-7,12-dione; aromatic ketones, for example, benzophenone, Michler's ketone, 4,4'-bis(dimethylamino)benzophenone; 4,4'-bis(diethylamino)benzophenone, 4-acryloxy-4'-diethylaminobenzophenone, 4-methoxy-4'-dimethylaminobenzophenone, xanthones, thioxanthones; and benzoin ethers, for example, benzoin methyl and ethyl ethers. Still other photoinitiators which are also useful, are described in U.S. Pat. No. 2,760,863 and include vicinal ketaldonyl alcohols, such as benzoin, pivaloin, acyloin ethers, alpha-hydrocarbonsubstituted aromatic acyloins, including alphamethylbenzoin, alpha-allylbenzoin and alphaphenylbenzoin. Additional systems include alphadiketones with amines as disclosed in Chang, U.S. Pat. No. 3,756,827, and benzophenone with p-dimethylaminobenzaldehyde or with esters of p-dimethylaminobenzoic acid as disclosed in Barzynski et al., U.S. Pat. No. 4,113,593.

Redox systems, especially those involving dyes, e.g., Rose Bengal® 2-dibutylaminoethanol, are also useful in the practice of this invention. Photoreducible dyes and reducing agents such as those disclosed in U.S. Pat. Nos. 2,850,445; 2,875,047; 3,097,096; 3,074,974; 3,097,097; 3,145,104; and 3,579,339; as well as dyes of the phenanzine, oxazine, and quinone classes can be used to initiate photopolymerization, the disclosures of which are incorporated herein by reference. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427–487.

Sensitizers

Sensitizers useful with these photoinitiators include those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769, the disclosures of which are incorporated hereby by reference.

A preferred group of visible sensitizers include the bis(p-dialkylaminobenzylidene) ketones disclosed in Baum and Henry, U.S. Pat. No. 3,652,275 and the arylyidene aryl ketones disclosed in Dueber, U.S. Pat. No. 4,162,162, as well as in U.S. Pat. Nos. 4,268,667 and 4,351,893, the disclosure of each being incorporated herein by reference. These compounds extend the sensitivity of the initiator system to visible wavelengths where lasers emit. Particularly preferred sensitizers are DMJDI: 2-{9'-(2',3',6',7'-tetrahydro-1H,5H-benzo[i,j]-quinolylidene}-5,6-dimethoxy-1-indanone (DMJDI) and JAW: 2,5-Bis{9'-(2',3',6',7'-tetrahydro-1H,5H-benzo[i,j]-quinolylidene)}cyclopentanone (JAW) which have the following structures:

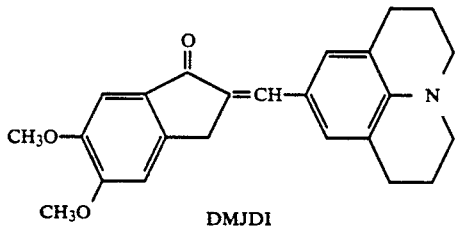

DMJDI

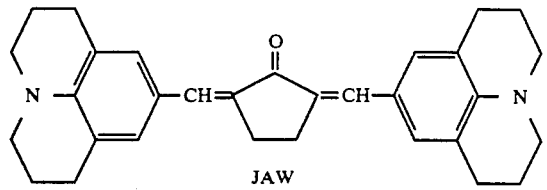

JAW

CHAIN TRANSFER AGENTS

Any chain transfer agent, or hydrogen donor, identified in the prior patents for use with HABI-initiated photopolymerizable systems can be used. For example, Baum and Henry, U.S. Pat. No. 3,652,275 discloses N-phenylglycine, 1,1-dimethyl-3,5-diketocyclohexane, and organic thiols such as 2-mercaptobenzothiazole, 2-mercaptobenzoxazole, 2-mercaptobenzimidazole, pentaerythritol tetrakis(mercaptoacetate), 4-acetamidothiophenol, mercaptosuccinic acid, dodecanethiol, and betamercaptoethanol, 2-mercaptoethane sulfonic acid, 1-phenyl-4H-tetrazole-5-thiol, 6-mercaptopurine monohydrate, bis-(5-mercapto-1,3,4-thiodiazol-2-yl, 2-mercapto-5-nitrobenzimidazole, and 2-mercapto-4-sulfo-6-chlorobenzoxazole, the disclosure of which is incorporated by reference. Also useful are various tertiary amines known in the art. Other hydrogen donor compounds useful as chain transfer agents in photopolymer compositions include various other types of compounds, e.g., (a) ethers, (b) esters, (c) alcohols, (d) compounds containing allylic or benzylic hydrogen cumene, (e) acetals, and (f) aldehydes, as disclosed in column 12, lines 18 to 48, of MacLachlan, U.S. Pat. No. 3,390,996, the disclosure of which is incorporated herein by reference. The preferred chain transfer agents are 2-mercaptobenzoxazole (2-MBO) and 2-mercaptobenzimidazole (2-MBI).

ADDITIONAL COMPONENTS

The photohardenable compositions may also contain other ingredients which are conventional components used in photopolymerizable systems. Such components include thermal stabilizers or thermal polymerization inhibitors, photoinhibitors, antihalation agents, UV absorbers, release agents, colorants, surfactants, plasticizers, electron donors, electron acceptors, charge carriers, etc.

Normally a thermal polymerization inhibitor will be present in small quantities, e.g., <0.1%, to increase stability in the storage of the photopolymerizable composition. Useful thermal polymerization inhibitors or thermal stabilizers include: hydroquinone, phenidone, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos, U.S. Pat. No. 4,168,982 are also useful, the disclosure of which is incorporated. The preferred stabilizer is TAOBN, i.e., 1,4,4-trimethyl-2,3-diazobicyclo-(3.2.2)-non-2-ene-N,N-dioxide. Photoinhibitors are disclosed in Pazos U.S. Pat. No. 4,198,242, the disclosure of which is incorporated herein by reference. A specific photoinhibitor is 1-(2'-nitro-4',5'-dimethoxy)phenyl-1-(4-t-butylphenoxy)ethane.

Antihalation agents useful in the photohardenable compositions include known antihalation dyes.

Ultraviolet radiation absorbing materials useful in the invention are also disclosed in U.S. Pat. No. 3,854,950, the disclosure of which is incorporated herein by reference.

Compounds present in the composition as release agents are described in Bauer, U.S. Pat. No. 4,326,010, the disclosure of which is incorporated herein by reference. A specific release agent is polycaprolactone.

Suitable plasticizers include: triethylene glycol, triethylene glycol dipropionate, triethylene glycol dicaprylate, triethylene glycol bis(2-ethyl hexanoate), tetraethylene glycol diheptanoate, polyethylene glycol, diethyl adipate, tributyl phosphate, etc. Other plasticizers that yield equivalent results will be apparent to those skilled in the art.

Suitable electron donors and acceptors are disclosed in Blanchet-Fincher et al., U.S. Ser. No. 07/116,655, filed Nov. 4, 1987, now U.S. Pat. No. 4,849,314, the disclosure of which is incorporated herein by reference.

Suitable charge carriers are disclosed in Blanchet-Fincher et al. U.S. Pat. No. 4,818,660, the disclosure of which is incorporated herein by reference.

PROPORTIONS

In general, the components should be used in the following approximate proportions: binder 40–70%, preferably 50–65%; monomer 20–40%, preferably 20–35%, initiator 1–20%, preferably 1–8%, and chain transfer agent or hydrogen donor 0–10%, preferably 0.1–4%. These are weight percentages based on total weight of the photopolymerizable system.

The preferred proportions depend upon the particular compounds selected for each component and the application for which the photohardenable composition is intended. For example, a high conductivity monomer can be used in smaller amount than a low conductivity monomer, since the former will be more efficient in eliminating charge from unexposed areas.

The amount of HABI will depend upon film speed requirement. Photohardenable compositions with HABI content above 10% provide films of high sensitivity (high speed) and can be used with laser imaging in recording digitized information, as in digital color proofing. Such films are the subject of Legere U.S. Ser. No. 07/284,861, filed Dec. 13, 1988. For analog applications, e.g., exposure through a negative, film speed requirement depends upon mode of exposure. Slow speed films are acceptable for analog applications.

COATING/SUBSTRATES

The photohardenable layer is prepared by mixing the ingredients of the photopolymerizable composition in a solvent, such as methylene chloride, usually in the weight ratio of about 15:85 to 25:75 (solids to solvent), coating on a substrate, and evaporating the solvent. Coatings should be uniform and should have a thickness of 3 to 20 $\mu$m, preferably 7 to 12 $\mu$m, when dry. Dry coating weight should be about 30 to 200 mg/dm$^2$, preferably 80 to 150 mg/dm$^2$. A coversheet, e.g., polyethylene, polypropylene, polyethylene terephthalate, etc. is preferably placed over the photohardenable layer after the solvent evaporates for protection.

The substrate should be uniform and free of defects such as pinholes, bumps, and scratches. It can be a support, such as paper, glass, synthetic resin and the like, which has been coated by vapor deposition or sputtering chemical deposition on one or both sides with a metal, conductive metal oxide, or metal halide, such as aluminized polyethylene terephthalate; or a conductive paper or polymeric film. The coated substrate mounted directly on a conductive support can be mounted directly on the printing device.

Alternatively, the substrate can be a non-conducting film, preferably a release film such as polyethylene or polypropylene. After removal of the protective cover sheet, the photohardenable layer can then be laminated to a conductive support on the printing device with the tacky, photohardenable layer adjacent to the support. The substrate then acts as a coversheet which is removed after exposure but prior to charging.

As another alternative, the conductive support may be a metal plate, such as aluminum, copper, zinc, silver or the like; or a support which has been coated with a polymeric binder containing a metal, conductive metal oxide, metal halide, conductive polymer, carbon, or other conductive filler.

ELECTRICAL CHARACTERISTICS

To evaluate the photopolymerizable compositions, voltage is measured on the unexposed photohardenable layer as a function of time using standard conditions of charging and measurement.

The desired electrical properties of the photohardenable element are dependent on the charge deposited on the photohardenable surface and the electrical characteristics of the particular toner system employed. Ideally, at the time of contact, e.g., with a developer dispersion, the voltage in the exposed areas (Vexp) should be at least 10 V, preferably at least 100 V and even up to 400 V or higher, more than that of the voltage in unexposed areas (Vunexp). Resistivity of the exposed areas should be between about $10^{14}$ and $10^{17}$ ohm-cm. Resistivity in the unexposed areas should be between $10^{12}$ and $10^{15}$ ohm-cm and the ratio of resistivity in exposed areas to resistivity in unexposed areas should be at least 100. A typical time for toner or developer application is between 1 and 5 seconds after charging.

EXPOSURE/CHARGING/TONING/TRANSFER

To provide the required conductivity differential, exposure must be sufficient to cause substantial polymerization in exposed areas. Exposing radiation can be modulated by either digital or analog means. Analog exposure utilizes a line or halftone negative or other pattern interposed between the radiation source and film. For analog exposure an ultraviolet light source is preferred, since the photopolymerizable system is most sensitive to shorter wavelength radiation. Digital exposure may be carried out by a computer controlled, light-emitting laser which scans the film in raster fashion. For digital exposure a high speed film, i.e., one which contains a high level of HABI and which has been sensitized to longer wavelengths with a sensitizing dye, is preferred. Electron beam exposure can be used, but is not preferred because of the expensive equipment required.

The preferred electrostatic charging means is corona discharge. Other charging methods include: discharge of a capacitor, negative corona discharge, shielded corotron, scorotron, etc.

Any electrostatic toner or developer and any method of developer application can be used. Liquid toners, i.e., a suspension of pigmented resin toner particles in a nonpolar dispersant liquid present in major amount, are preferred. The liquids normally used are Isopar® branched-chain aliphatic hydrocarbons (sold by Exxon Corporation) which have a Kauri-butanol value of less than 30. These are narrow high-purity cuts of isoparaffinic hydrocarbon fractions with the following boiling ranges Isopar®-G, 157–176° C., Isopar®-H 176–191° C., Isopar®-K 177–197° C., Isopar®-L 188–206° C., Isopar®-M 207–254° C., Isopar®-V 254–329° C. The liquid developers may contain various adjuvants which are described in: Mitchell, U.S. Pat. Nos. 4,631,244, 4,663,264, and 4,734,352; Taggi, U.S. Pat. No. 4,670,370; El-Sayed and Taggi, U.S. Pat. No. 4,702,984; Larson, U.S. Pat. No. 4,702,985; Trout, U.S. Pat. No. 4,707,429; Larson and Trout U.S. Pat. No. 4,681,831. The liquid electrostatic developers can be prepared as described in Larson U.S. Pat. No. 4,760,009. The disclosures in these patents are incorporated herein by reference.

Also present in the liquid electrostatic developers are thermoplastic resins, having an average particle size of less than 10 μm, which are, for example, copolymers of ethylene (80 to 99.9 %) with acrylic acid, methacrylic acid, or alkyl esters, where alkyl is 1 to 5 carbon atoms, of acrylic or methacrylic acid (20 to 0.1 %), e.g., an ethylene/methacrylic acid (89:11) copolymer having a melt index at 190° C. of 100. Preferred nonpolar liquid soluble ionic or zwitterionic components present in such developers, for example, are lecithin and Basic Barium Petronate® oil-soluble petroleum sulfonate, Witco Chem. Corp., New York, NY.

Many of the monomers useful in the photohardenable composition described above are soluble in these Isopar® hydrocarbons, especially in Isopar®-L. Consequently, repeated toning with Isopar®-based developers to make multiple copies can deteriorate the electrical properties of the photohardenable master by extraction of monomer from unexposed areas. The preferred monomers are relatively insoluble in Isopar® hydrocarbons, and extended contact with these liquids does not unduly deteriorate photohardenable layers made with these monomers. Photohardenable electrostatic masters made with other, more soluble monomers can still be used to make multiple copies, using liquid developer having a dispersant with less solvent action.

Representative dry electrostatic toners that may be used include: Kodak Ektaprint K, Hitachi HI-Toner HMT-414, Canon NP-350F toner, Toshiba T-50P toner, etc.

After developing the toned image is transferred to a receptor surface, such as paper, for the preparation of a proof. Other receptors are polymeric film, or cloth. For making integrated circuit boards, the transfer surface can be an insulating board on which conductive circuit lines can be printed by the transfer, or the surface can be an insulating board covered with a conductor, e.g., a fiber glass board covered with a copper layer, on which a resist is printed by transfer.

Transfer is accomplished by electrostatic or other means, e.g., by contact with an adhesive receptor surface. Electrostatic transfer can be accomplished in any known manner, e.g., by placing the receptor surface, e.g., paper, in contact with the toned image. A tackdown roll or corona, when held at negative voltages, will press the two surfaces together assuring intimate contact. After tackdown, a positive corona discharge is applied to the backside of the paper to drive the toner particles off the electrostatic master onto the paper.

INDUSTRIAL APPLICABILITY

The photohardenable electrostatic master having improved environmental latitude is particularly useful in the graphic arts field, especially in the area of color proofing wherein the proofs prepared duplicate the images produced by printing. This is accomplished by controlling the gain of the reproduced halftone dots through control of the electrical conductivity of the exposed and unexposed areas of the photohardenable electrostatic master. Since the voltage retained by the halftone dots is almost linearly related to the percent dot area, the thickness of the liquid electrostatic developer will be constant everywhere on the image, independent of the particular dot pattern to be developed. Other uses for the photohardenable master include preparation of printed circuit boards, resists, soldermask, photohardenable coatings, etc.

EXAMPLES

The advantageous properties of this invention can be observed by reference to the following examples which illustrate, but do not limit, the invention.

Glossary

BINDERS

B1 Polymethtl methacrylate n=1.25, where n is the inherent viscosity Tg=110° C., where Tg is the glass transition temperature
B2 Methyl methacrylate resin, n=0.18, Tg=105° C.
B3 Ethyl methacrylate resin, n=1.50 and Tg=70° C.
B4 Isobutyl methacrylate resin, n=0.64, Tg=55° C.
B5 Ethyl methacrylate resin, n=0.83, Tg=63° C.
B6 Methacrylate copolymer resin, n=0.40, Tg=40° C.
B7 Poly(styrene/methylmethacrylate)70/30 Tg=95° C.
B8 Polycarbonate, Tg=150° C.
B9 Polysulfone, Tg=190° C.
B10 Cycolac® CTB acrylonitrile/butadiene/styrene, Tg=80° C.–84° C.

MONOMERS

M1 Ethoxylated trimethylolpropane triacrylate
M2 Trimethylolpropane triacrylate
M3 Glycerol propoxylylated triacrylate
M4 tris-(2-hydroxyethyl isocyanurate) triacrylate

CHAIN TRANSFER AGENTS

CT1 2-mercaptobenzoxazole
CT2 2-mercaptobenzimidazole

INITIATORS

I1 2,2',4,4'-tetrakis(o-chlorophenyl)-5,5'-bis(m,p-dimethoxyphenyl)biimidazole
I2 2,2'-bis(o-chlorophenyl)-4,4',5,5'-tetraphenylbiimmidazole
I3 2,2'-bis(o-chlorophenyl)-5,5'-bis(m-methoxyphenyl)-biimidazole
I4 2-ethylanthraquinone
I5 Benzoin methyl ether

ADDITIVES

A1 triphenylamine
A2 tris-(o-methyl-p-diethylaminophenyl)methane
A3 p-toluenesulfonic acid
A4 phenidone A5    1-(2'-nitro-4',5'-dimethoxy)phenyl-1-(4-t-butyl-phenoxy)ethane

STABILIZER

S1    1,4,4-trimethyl-2,3-diazobicyclo-(3,2,2)-non-2-ene-2,3-dioxide

Except as indicated otherwise, the following procedures were used in all examples.

A solution containing about 80 parts methylene chloride and 20 parts of solids was coated onto a 0.004 inch (0.0102 cm) aluminized polyethylene terephthalate support. After the film had been dried at 60–95° C. to remove the methylene chloride, a 0.00075 inch (0.0019 cm) polypropylene cover sheet was laminated to the dried layer. The coating weights varied from 80 to 150 mg/dm². The film was then wound on rolls until exposure and development occurred.

The formulations were tested for electrical properties as a function of ambient conditions. The environmental stability was evaluated by measuring the shift in transit times ($a_T$) of each material with temperature (T) and relative humidity (RH), where the transit time $\tau$ is the time interval required by the charge carriers to travel across the sample and reach the ground plane of the material.

It has been found that by plotting the voltage decay or discharge curves of the electrostatically charged photohardenable master at different environmental conditions noted below the curves are related to each other. If both voltage and time are plotted as log (t) (x axis) and log (V) (y axis) then the discharge curves at differing environmental conditions can be superimposed by horizontal shifts along the log (time) axis. The time dependence of the voltage is expressed as:

$$V(t) = f(t/\tau)$$

where $\tau$ is the transit time for any given environmental condition. $\tau$ is dependent upon the environmental conditions, i.e., temperature and humidity, but the function $f(t/\tau)$ is invariant. As a result $\tau$ defines the changes in the discharge characteristics within the specified environmental conditions. The shift factor $a_T = \tau_1/\tau_2$ wherein $\tau_2$ and $\tau_2$ are the longer and shorter discharge times for two differing environmental conditions. $a_T$ provides a direct and straight forward way of comparing the relative humidity and temperature response of the different formulations. A smaller number for $a_T$ indicates lower environmental sensitivity. $a_T$ is 15 or less, preferably 10 or less.

The formulations were tested for the change in discharge rate (i.e., shift in transit time ($a_T$)) at the specified ambient conditions. The environmental specifications were set to be the standard operating conditions of print shops worldwide, i.e., 30% ≦ relative humidity (RH) ≦ 60% and 60° F. (15.6° C.) ≦ temperature (T) ≦ 80° F. (26.7° C.). The electrostatic setup was placed in a small Tinney Benchmark environmental chamber which permitted accurate control of the environment in the T and RH range of interest (Tenney Engineering, Inc., South Brunswick, NJ).

Surface voltage measurements were carried out as follows: 1 inch by 0.5 inch (2.52 cm by 1.27 cm) samples were mounted on a flat aluminum plate that was positioned on a friction free translational stage connected to a solenoid. The samples were moved from position A to B, about 1 inch (2.54 cm) apart, by activating the solenoid. In position A, they were placed directly under a scorotron for charging. The charging conditions were: 100–500 V grid voltage (Vg), 100–1000 microamps corona current (4.35 to 5.11 kV) and 2 seconds charging time. After charging was complete, the solenoid was energized and the samples moved to B, away from the scorotron and directly under Isoprobe electrostatic multimeters, Model #174, manufactured by Monroe Electronics, Lundonville, NY. The outputs from the multimeters were fed into a computer (Model #9836, manufactured by Hewlett Packard, Palo Alto, CA) through a data acquisition box (Model #3852A, manufactured by Hewlett Packard, Palo Alto, CA) where the voltage versus time was recorded for each sample. Since movement of the samples took about 1 second, the "zero time" measurement was made within about 1 second after charging.

In order to test the image quality of each photopolymerizable composition, the photopolymerizable layer was exposed, charged, and toned with magenta toner, and the image transferred to paper as described below. In all cases "magenta toner" refers to the standard magenta toner used to form a four color proof described below. The evaluation of image quality was based on dot range and dot gain on paper. The standard paper is 60 lbs Solitaire ® paper, offset enamel text, Plainwell Paper Co., Plainwell, MI. However, the variety of papers tested included: 60 lbs Plainwell offset enamel text, 70 lbs Plainwell offset enamel text, 150 lbs white regal Tufwite ® Wet Strength Tag, 60 lbs White LOE Gloss Cover, 70 lbs white Flokote ® Text, 60 lbs white all purpose lith, 110 lbs white Scott index, 70 lbs white Nekoosa Vellum Offset and 80 lbs white Sov ® text. Results indicated that, although the process can be used with any paper, the trapping of ink varies with the fibrillar nature of the paper in use.

Dot gain or dot growth versus dot size is a standard measure of how tolerances between a proof and a press proof are determined. The dot gains were measured using designed patterns called Brunner targets which are available from System Brunner USA, Inc., Rye, NY. Typically desired dot gains for graphic arts applications are in the range of 15 to 22% at midtone. The dot range was easily tested using URGA targets, Graphic Arts Technical Foundation, Pittsburgh, PA, that include 0.5% highlight dots to 99.5% shadow dots and in a 133 lines/mm screen that includes 4 μm highlights and shadow microlines. Typically desired dot ranges for graphic arts applications in the range of 2 to 98%.

The photohardenable electrostatic master was first exposed through a separation negative using a Douthitt Option X Exposure Unit (Douthitt Corp., Detroit, MI), equipped with a model TU 64 Violux ®5002 lamp assembly (Exposure Systems Corp., Bridgeport, CT) and model No. 5027 photopolymer type lamp. Exposure times varied from 1–100 seconds depending on the formulation. The exposed master was then mounted on a drum surface. SWOP (Specification Web Offset Publications) density in the solid regions was obtained by charging the fully exposed regions of the photopolymerizable of the electrostatic master to 100 to 200 V. The charged latent image was then developed with a liquid electrostatic developer, or toner, using a two roller toning station and the developer layer properly metered. The developing and metering stations were placed a 5 and 6 o'clock respectively. The toner image was corona transferred onto paper using 50–150 microamps transfer corona and 4.35 to 4.88 kV, and −2.5 to —4.0 kV tackdown roll voltage at a speed of 2.2 inches/second (5.59 cm/second) and fused in an oven for 10 seconds at 100° C.

The dot gain curves were measured using a programmable MacBeth densitometer, Model #RD 918, (McBeth Process Measurements, Newburgh, NY) interfaced to a Hewlett Packard Computer, Model #9836. The dot gain curve was calculated by using a simple algorithm that included the optical density of the solid patch, the optical density of the paper (gloss) and the optical density of each percent dot area in the Brunner target.

A four color proof is obtained by following the steps described below. First, complementary registration marks are cut into the photopolymerizable layers of the electrostatic masters prior to exposure. Masters for each of the four color separations are prepared by exposing four photopolymerizable elements having coversheets to one of the four color separation negatives corresponding to cyan, yellow, magenta and black colors. Each of the four photopolymerizable layers is exposed for about 3 seconds using the Douthitt Option X Exposure Unit described above. The visible radiation emitted by this source is suppressed by a UV light transmitting, visible light absorbing Kokomo ® glass filter (No. 400, Kokomo Opalescent Glass Co., Kokomo, IN). The cover sheets are removed, and each master is mounted on the corresponding color module drum, in a position assuring image registration of the four images as they are sequentially transferred from each master to the receiving paper. The leading edge clamps are also used to ground the photopolymer aluminized backplane to the drum. The masters are stretched by spring loading the trailing edge assuring that each lays flat against its drum.

Each module comprised a charging scorotron at 3 o'clock position, a developing station at 6 o'clock, a metering station at 7 o'clock and a cleaning station at 9 o'clock. The charging, developing, and metering procedure is similar to that described above prior to the examples. The transfer station consists of a tackdown roll, a transfer corona, paper loading, and a positioning device that fixes the relative position of paper and master in all four transfer operations.

In the preparation of the four-color proof the four developers, or toners, have the following compositions:

| INGREDIENTS | AMOUNT (g) |
|---|---|
| BLACK | |
| Copolymer of ethylene (89%) and methacrylic acid (11%), melt index at 190° C. is 100, Acid No. is 66 | 2,193.04 |
| Sterling NF carbon black | 527.44 |
| Heucophthal Blue, G XBT-583D Heubach, Inc., Newark, NJ | 27.76 |
| Basic Barium Petronate ®, Witco Chemical Corp., New York, NY | 97.16 |
| Aluminum tristearate, Witco 132 Witco Chemical Corp., New York, NY | 27.76 |
| Isopar ®-L, non-polar liquid having a Kauri-Butanol value of 27, Exxon Corporation | 13,047.0 |
| CYAN | |
| Copolymer of ethylene (89%) and methacrylic acid (11%), melt index at 190° C. is 100, Acid No. is 66 | 3,444.5 |
| Ciba-Geigy Monarch Blue X3627 | 616.75 |
| Dalamar ® Yellow YT-858D Heubach, Inc., Newark, NJ | 6.225 |
| Aluminum tristearate, as described in black developer | 83.0 |
| Basic Barium Petronate ® (Witco Chemical Corp.) | 311.25 |
| Isopar ®-L as described in black developer | 16,60.0 |
| MAGENTA | |
| Copolymer of ethylene (89%) and methacrylic acid (11%), melt index at 190° C. is 100, Acid No. is 66 | 4,380.51 |
| Mobay RV-6700, Mobay Chemical Corp., Haledon, NJ | 750.08 |
| Mobay RV-6713, Mobay Chemical Corp. Haledon, NJ | 750.08 |
| Aluminum tristearate, as described in black developer | 120.014 |
| Triisopropanol amine | 75.008 |
| Basic Barium Petronate ® (Witco Chemical Corp.) | 720.08 |
| Isopar ®-L as described in black developer | 32,540.0 |
| YELLOW | |
| Copolymer of ethylene (89%) and methacrylic acid (11%), melt index at 190° C. is 100, Acid No. is 66 | 1,824.75 |
| Yellow 14 polyethylene flush, Sun Chemical Co., Cincinnati, OH | 508.32 |
| Aluminum tristearate, as described in black developer | 46.88 |
| Basic Barium Petronate ® (Witco Chemical Corp.) | 59.5 |
| Isopar ®-L as described in black developer | 11,570.0 |

First, the cyan master is charged, developed and metered. The transfer station is positioned and the toned cyan image transferred onto the paper. After the cyan transfer is completed, the magenta master is corona charged, developed and metered, and the magenta image transferred, in registry, on top of the cyan image. Afterwards, the yellow master is corona charged, developed, and metered, and the yellow image is transferred on top of the two previous images. Finally the black master is corona charged, developed, metered, and the toned black image transferred, in registry, on top of the three previously transferred images. After the procedure is completed, the paper is carefully removed from the transfer station and the image fused for 15 seconds at 100° C.

The parameters used for preparation of the proof are: drum speed, 2.2 inches/second (5.588 cm/second); grid scorotron voltage, 100 to 400 V; scorotron current 200 to 1000 microamps (5.11 to 6.04 kV); metering roll voltage, 20 to 200 V; tackdown roll voltage, −2.5 to −5.0 kV; transfer corona current, 50 to 150 microamps (4.35 to 4.88 kV); metering roll speed, 4 to 8 inches/second (10.16 to 20.32 cm/second.); metering roll gap, 0.002 to 0.005 inch (0.51 to 0.0127 mm); developer conductivity 12 to 30 picomhos/cm; developer concentration, 1 to 1.5% solids.

EXAMPLE 1

Solutions of photopolymerizable compositions were prepared containing 80 parts of methylene chloride and 20 parts of solids. The solids comprised monomer or combination of monomers, binder or combinations of binders, initiator and chain transfer agent. The solutions were coated on 0.004 inch (0.0102 cm) aluminized polyethylene terephthalate support and a 0.00075 inch (0.001905 cm) polypropylene cover sheet. The coating weights varied from 80 to 150 mg/cm2 or an approximate thickness of 7 μm to 12 μm in sample thickness.

The photopolymerizable layer for each element had the following composition wherein the amounts are in percentages by weight.

| SAMPLE | Amount (%) | | | | | |
|---|---|---|---|---|---|---|
| | M3 | M2 | I1 | CT1 | B7 | B3 |
| CONTROL 1 | 24 | 10 | 5 | 3 | 58 | |
| CONTROL 2 | 22 | 10 | 5 | 3 | | 60 |
| EXAMPLE 1 | 20 | 13 | 5 | 3 | 39 | 20 |

Results are shown in Table 2 below.

TABLE 2

| SAMPLE | $a_T$ |
|---|---|
| CONTROL 1 | 20 |
| CONTROL 2 | 22 |
| EXAMPLE 1 | 6 |

This table illustrates improved (less) T/RH sensitivity of Example 1 (mixed binders) versus the controls (single binder).

EXAMPLE 2

Six photopolymerizable elements were prepared and tested as described in Example 1 with the following exceptions: the photopolymerizable layer for each element had the composition shown in Table 3 below. Results are also shown in Table 3.

TABLE 3

| # | M3 | M1 | M2 | M4 | I1 | CT1 | CT2 | B7 | B3 | $a_T$ |
|---|---|---|---|---|---|---|---|---|---|---|
| 1 | 30 | | | | 5 | 3 | | 43 | 19 | 8.5 |
| 2 | | 28 | | | 5 | 3 | | 35 | 19 | 12 |
| 3 | | | 36 | | 5 | 3 | | 37 | 19 | 10 |
| 4 | | | | 45 | 5 | 3 | | 30 | 17 | 4 |
| 5 | 32 | | | | | 6 | 2 | 37 | 20 | 14 |

TABLE 3-continued

| # | M3 | M1 | M2 | M4 | I1 | CT1 | CT2 | B7 | B3 | $a_T$ |
|---|---|---|---|---|---|---|---|---|---|---|
| 6 | 35 | | | | 5 | | 3 | 30 | 17 | 15 |

All $a_T$'s (transit times) are improvements over Controls 1 and 2 of Example 1.

EXAMPLE 3

Six photopolymerizable elements were prepared and tested as described in Example 1 with the following exceptions: the photopolymerizable layer for each element had the composition shown in Table 4 below. Results are also shown in Table 4.

TABLE 4

| # | M3 | M1 | M2 | I1 | I2 | I4 | I5 | CT1 | B7 | B3 | $a_T$ |
|---|---|---|---|---|---|---|---|---|---|---|---|
| 1 | | | 30 | | 10 | | | 3 | 32 | 25 | 9 |
| 2 | 28 | | | | 5 | | | 3 | 44 | 20 | 11 |
| 3 | | 27 | | | | 5 | | 3 | 45 | 20 | 9 |
| 4 | 30 | | | | | 7.5 | | 3 | 40 | 19.5 | 4 |
| 5 | 30 | | | | 2 | | | 3 | 46 | 20 | 10 |
| 6 | | 28 | | 3 | | | | 3 | 46 | 20 | 7 |

All $a_T$'s are improvements over Controls 1 and 2 of Example 1.

EXAMPLE 4

Fifteen photopolymerizable elements (three were controls) were prepared and tested as described in Example 1 with the following exceptions: the photopolymerizable layer for each element had the composition shown in Table 5 below. Results are also shown in Table 5.

TABLE 5

| # | M2 | M3 | I1 | CT1 | B1 | B3 | B4 | B5 | B6 | B7 | B8 | B9 | B10 | $a_T$ |
|---|---|---|---|---|---|---|---|---|---|---|---|---|---|---|
| C1 | 10 | 24 | 5 | 3 | | | | | | 58 | | | | 28 |
| C2 | 10 | 26 | 5 | 3 | | | | | | | 56 | | | 20 |
| C3 | 10 | 23 | 5 | 3 | 59 | | | | | | | | | 40 |
| 1 | 10 | 20 | 5 | 3 | | | | | 20 | 42 | | | | 9 |
| 2 | 10 | 20 | 5 | 3 | | | | 20 | | 40 | | | | 9 |
| 3 | 12 | 20 | 5 | 3 | | 20 | | | | 40 | | | | 8 |
| 4 | 10 | 20 | 5 | 3 | | | | | | 42 | | | | 9 |
| 5 | 8.3 | 16.6 | 5 | 3 | | | | | | 44.7 | 22.4 | | | 9.5 |
| 6 | 11.4 | 22.6 | 5 | 3 | | 19.3 | | | | | | 38.7 | | 6 |
| 7 | 8.2 | 16 | 5 | 3 | | | | | | 45.2 | | | 22.6 | 9 |
| 8 | 14 | 20 | 5 | 3 | | 20 | | | | | 38 | | | 8.5 |
| 9 | 12 | 20 | 5 | 3 | | | | | 22 | | 40 | | | 9 |
| 10 | 16 | 12 | 5 | 3 | | 20 | | | | | 34 | | | 10 |
| 11 | 36 | — | 5 | 3 | 37 | 19 | | | | | | | | 10 |
| 12 | 10 | 210 | 5 | 3 | 42 | 20 | | | | | | | | 9 |

EXAMPLE 5

Fifteen photopolymerizable elements were prepared and tested as described in Example 1 with the following exceptions: The photopolymerizable layer for each element had the composition shown in Table 6 below. Results are also shown in Table 6.

TABLE 6

| # | M3 | M2 | M1 | I1 | CT1 | A3 | A2 | A1 | B7 | B1 | B3 | B4 | B5 | B8 | A4 | A5 | $a_T$ | Dot Range (%) | Dot Gain (%) |
|---|---|---|---|---|---|---|---|---|---|---|---|---|---|---|---|---|---|---|---|
| 1 | 27.5 | | | 1.5 | 3 | 2 | 2 | 5 | | 40 | | | 19 | | | | 8 | 1-98 | 17 |
| 2 | 27.5 | | | 1.5 | 3 | 2 | 2 | 5 | | 40 | | | | 19 | | | 8 | 0.5-97 | 16 |
| 3 | 27.5 | | | 1.5 | 3 | 2 | 2 | 5 | | 40 | 19 | | | | | | 8 | 1-98 | 16 |
| 4 | 27.5 | | | 1.5 | 3 | 2 | 2 | 5 | 40 | | 19 | | | | | | 6 | 3-98 | 9 |
| 5 | 28 | | | 1.5 | 3 | 2 | 2 | 5 | 39 | | 10 | 10 | | | | | 5 | 1-98 | 20 |
| 6 | 27.5 | | | 1.5 | 3 | 2 | 2 | 5 | 20 | 20 | 9 | 10 | | | | | 8 | 3-99 | 11 |
| 7 | 20 | | 8.5 | 1 | 3.5 | 2 | 2 | 4.5 | 20 | 20 | 8 | 10 | | | | | 8 | 2-98 | 13 |

TABLE 6-continued

| # | M3 | M2 | M1 | I1 | CT1 | A3 | A2 | A1 | B7 | B1 | B3 | B4 | B5 | B8 | A4 | A5 | $a_T$ | Dot Range (%) | Dot Gain (%) |
|---|---|---|---|---|---|---|---|---|---|---|---|---|---|---|---|---|---|---|---|
| 8 |  | 30 |  | 3 | 0.1 | 2 | 2 | 5 | 40 |  | 17.9 |  |  |  |  |  | 7 | 0.5-97 | 22 |
| 9 | 16 | 8 |  | 5 | 3.15 | 2.5 | 2.5 | 3.5 | 46 |  | 13 |  |  |  | 0.05 | 0.3 | 6 | 2-98 | 16 |
| 10 | 19 | 8 |  | 2 | 1 | 3.5 | 3.5 | 4 | 45 |  |  |  | 14 |  |  |  | 8 | 2-96 | 18 |
| 11 | 19 | 9 |  | 2 | 1 | 3 | 3 | 4 | 45 |  |  |  | 14 |  |  |  | 6 | 2-97 | 16 |
| 12 | 17.2 | 8.08 | 4.04 | 2.02 | 3.03 | 3.03 | 3.25 | 43.85 |  | 15.2 |  |  |  |  | 0.05 | 0.3 | 5 | 2-96 | 16 |
| 13 |  | 30 |  | 1 | 2 | 3 | 3 | 4 |  |  |  |  | 13 | 44 |  |  | 9 | 1-97 | 22 |
| 14 |  | 30 |  | 1 | 2 | 3 | 3 | 4 |  |  | 14 |  |  | 43 |  |  | 9.5 | 1-98 | 18 |
| 15 |  | 28 |  | 1 | 2 | 3 | 3 | 4 |  |  |  | 13 |  | 44 |  |  | 7.5 | 1-98 | 14 |

EXAMPLE 6

This example illustrates the use of the photohardenable electrostatic master to prepare a four color proof.

The following composition was prepared from the indicated ingredients in parts:

| M3 | M2 | I1 | B7 | B3 | CT1 | A1 | A2 | A3 | A4 | A5 |
|---|---|---|---|---|---|---|---|---|---|---|
| 17.2 | 8.1 | 4 | 43.83 | 15.15 | 2 | 3.2 | 3 | 3 | 0.05 | 0.3 |

After the solution was stirred for 24 hr to properly dissolve all the components, it was coated onto aluminized polyethylene terephthalate at 150 ft/min (45.7 m/min) coating speed. Coating weight was 130 mg/dm$^2$. A polypropylene cover sheet was placed on the photopolymer surface immediately after drying. The material thus formed was cut into four pieces about 30 inch by 40 inch (76.2 cm by 101.6 cm) for preparation of a four color proof.

A four color proof was obtained by following the general procedure for making a four color proof outlined above using cyan, magenta, yellow and black photohardenable electrostatic masters.

WHAT IS CLAIMED IS:

1. An improved photohardenable electrostatic master having reduced temperature and humidity sensitivity comprising
   (1) an electrically conductive substrate, and
   (2) a layer of photohardenable composition consisting essentially of
      (a) at least two organic polymeric binders,
      (b) at least one monomeric compound having at least one ethylenically unsaturated group, and
      (c) a photoinitiator or photoinitiator system that activates polymerization of the ethylenically unsaturated monomer upon exposure to actinic radiation, the improvement wherein the photohardenable composition contains at least one binder having a Tg greater than 80° C. and at least one binder having a Tg less than 70° C. such that the shift in transit time ($a_T$) of the photohardenable layer in the range 30% ≦ relative humidity ≦ 60% and 60° F. (15.6° C.) ≦ temperature ≦ 80° F. (26.7° C.) is 15 or less.

2. An photohardenable electrostatic master according to claim 1 wherein the binder having a Tg greater than 80° C. is selected from the group consisting of acrylate and methacrylate polymers and copolymers, vinyl polymers and copolymers, polyvinyl acetals, polycarbonates, polysulfones, polyetherimides, and polyphenylene oxides.

3. A photohardenable electrostatic master according to claim 2 wherein the binder is a methacrylate polymer or copolymer.

4. A photohardenable electrostatic master according to claim 3 wherein the binder is poly(styrene/methyl methacrylate).

5. A photohardenable electrostatic master according to claim 3 wherein the binder is poly(methyl methacrylate).

6. A photohardenable electrostatic master according to claim 2 wherein the binder is polycarbonate.

7. A photohardenable electrostatic master according to claim 2 wherein the binder is polysulfone.

8. A photohardenable electrostatic master according to claim 1 wherein the binder with a Tg less than 70° C. is selected from the group consisting of acrylate and methacrylate polymers and copolymers, vinyl polymers and copolymers, polyvinyl acetals, polyesters, polyurethanes, butadiene copolymers, cellulose esters and cellulose ethers.

9. A photohardenable electrostatic master according to claim 8 wherein the binder is a methacrylate polymer or copolymer.

10. A photohardenable electrostatic master according to claim 9 wherein the binder is poly(ethyl methacrylate).

11. A photohardenable electrostatic master according to claim 9 wherein the binder is poly(isobutyl methacrylate).

12. A photohardenable electrostatic master according to claim 9 wherein the binder is poly(cyclohexyl methacrylate).

13. A photohardenable electrostatic master according to claim 8 wherein the binder is poly(tertiarybutyl acrylate).

14. A photohardenable electrostatic master according to claim 1 wherein a monomeric compound (b) is an acrylate or methacrylate compound having at least two terminal ethylenically unsaturated groups.

15. A photohardenable electrostatic master according to claim 14 wherein a monomeric compound is glycerol propoxylated triacrylate.

16. A photohardenable electrostatic master according to claim 1 wherein the at least one monomeric compound is a mixture of glycerol propoxylated triacrylate and trimethylolpropane triacrylate.

17. A photohardenable electrostatic master according to claim 1 wherein the photoinitiator is a 2,4,5-triphenylimidazolyl dimer.

18. A photohardenable electrostatic master according to claim 17 wherein the photoinitiator is 2,2',4,4'-tetrakis(o-chlorophenyl)-5,5'-bis(m,p-dimethoxyphenyl)-biimidazole.

19. A photohardenable electrostatic master according to claim 17 wherein the photoinitiator is 2,2'-bis(o-chlorophenyl)-5,5'-bis(m-methoxyphenyl)biimidazole.

20. A photohardenable electrostatic master according to claim 17 wherein a chain transfer agent is present.

21. A photohardenable electrostatic master according to claim 20 wherein the chain transfer agent is 2-mercaptobenzoxazole.

22. A photohardenable electrostatic master according to claim 20 wherein the chain transfer agent is 2-mercaptobenzimidazole.

23. A photohardenable electrostatic master according to claim 1 wherein the photoinitiator is a substituted or unsubstituted polynuclear quinone.

24. A photohardenable electrostatic master according to claim 23 wherein the photoinitiator is 2-ethylanthraquinone.

25. A photohardenable electrostatic master according to claim 1 wherein the photoinitiator is a benzoin ether.

26. A photohardenable electrostatic master according to claim 25 wherein the photoinitiator is benzoin methyl ether.

27. A photohardenable electrostatic master according to claim 1 wherein a sensitizer compound is present.

28. A photohardenable electrostatic master according to claim 27 wherein the sensitizer compound is 2-{9'-(2',3',6',7'-tetrahydro-1H, 5H-benzo[i,j ]-quinolyidene)}-5,6-dimethoxy-1-indanone..

29. A photohardenable electrostatic master according to claim 1 wherein the layer of photohardenable composition consists essentially of
    (a) poly(styrene/methyl methacrylate) and poly(ethyl methacrylate),
    (b) a monomeric compound selected from the group consisting of glycerol propoxylated triacrylate, trimethylol propane triacrylate and mixtures thereof, and
    (c) 2,2',4,4'-tetrakis(o-chlorophenyl)-5,5'-bis(m,p-dimethoxyphenyl)biimidazole and 2-mercaptobenzoxazole.

30. A photohardenable electrostatic master according to claim 1 wherein the polymeric binder component
    (a) is present in 40 to 70% by weight, the monomeric compound component (b) in 20 to 40% by weight, and the photoinitiator component (c) in 1 to 20% by weight, the weight percentages based on the total weight of the photohardenable composition.

* * * * *